United States Patent
Lin et al.

(10) Patent No.: US 7,619,271 B2
(45) Date of Patent: Nov. 17, 2009

(54) DEEP TRENCH DEVICE WITH SINGLE SIDED CONNECTING STRUCTURE AND FABRICATION METHOD THEREOF

(75) Inventors: Shian-Jyh Lin, Taipei County (TW); Chien-Li Cheng, Hsinchu (TW)

(73) Assignee: Nanya Technology Corporation, Taoyuan (TW)

( * ) Notice: Subject to any disclaimer, the term of this patent is extended or adjusted under 35 U.S.C. 154(b) by 12 days.

(21) Appl. No.: 11/940,547

(22) Filed: Nov. 15, 2007

(65) Prior Publication Data
US 2009/0014768 A1 Jan. 15, 2009

(30) Foreign Application Priority Data
Jul. 11, 2007 (TW) ............................... 96125181 A

(51) Int. Cl.
*H01L 29/94* (2006.01)
(52) U.S. Cl. ............... 257/301; 257/532; 257/E29.218; 257/E29.346; 365/149
(58) Field of Classification Search ................. 257/301, 257/532, E29.218, E29.346; 365/149
See application file for complete search history.

(56) References Cited

U.S. PATENT DOCUMENTS 6,423,607 B1 * 7/2002 Heineck et al. ............. 438/386
6,936,879 B2 * 8/2005 Furukawa et al. ........... 257/301
6,989,560 B2 * 1/2006 Koike et al. ................. 257/296
2008/0142862 A1 * 6/2008 Liao et al. .................... 257/303

* cited by examiner

Primary Examiner—Davienne Monbleau
Assistant Examiner—Eduardo A Rodela
(74) Attorney, Agent, or Firm—Quintero Law Office

(57) ABSTRACT

A deep trench device with a single sided connecting structure. The device comprises a substrate having a trench therein. A buried trench capacitor is disposed in a lower portion of the trench. An asymmetric collar insulator is disposed on an upper portion of the sidewall of the trench. A connecting structure is disposed in the upper portion of the trench, comprising an epitaxial silicon layer disposed on and adjacent to a relatively low portion of the asymmetric collar insulator and a connecting member disposed between the epitaxial silicon layer and a relatively high portion of the asymmetric collar insulator. A conductive layer is disposed between the relatively high and low portions of the asymmetric collar insulator, to electrically connect the buried trench capacitor and the connecting structure. A cap layer is disposed on the connecting structure. A fabrication method for a deep trench device is also disclosed.

8 Claims, 11 Drawing Sheets

DEEP TRENCH DEVICE WITH SINGLE SIDED CONNECTING STRUCTURE AND FABRICATION METHOD THEREOF

BACKGROUND OF THE INVENTION

1. Field of the Invention

The present invention relates to a semiconductor memory device and in particular to a connecting structure of a deep trench capacitor in a memory device and a fabrication method thereof.

2. Description of the Related Art

In the rapidly evolving integrated circuit industry, the developmental trend is toward high performance, miniaturization, and high operating speeds. Accordingly, dynamic random access memory (DRAM) fabrication methods have developed rapidly. In particular, an increase of large memory capacity is important for DRAMs. Typically, DRAM cells include a transistor and a capacitor. With DRAM capacity reaching 512 MB, the size of memory cells and transistors have shrunk to meet demands for higher integration, higher memory capacity and higher operating speeds. For conventional planar capacitor technology however, relatively more useable surface area on an integrated circuit is required, thus making it difficult to meet the previously mentioned demands. Accordingly, three dimensional (3-D) technology, such as deep trench capacitor technology, has been applied to DRAM fabrication with the goal of reducing the area occupied by the transistor and the capacitor on the semiconductor substrate.

Nevertheless, as transistor size decreases, buried straps (BS), which serve as a portion of the transistor drain region and electrically connects the vertical transistors and the trench capacitors, between neighboring trenches may merge. This is called BS merge. The buried strap is formed by the thermal diffusion of high ion concentrations doped in a conductive layer in the memory cell into the substrate. This is called BS out-diffusion. If the diffusion area of the buried strap is excessive, the merging of buried straps between neighboring trenches may result, inducing short circuiting of the semiconductor memory device.

In order to prevent short circuiting of the semiconductor memory device, a trench device with a single sided buried strap has been developed to eliminate BS merge. The active area of the transistor, however, must be reduced as the memory cell density is increased. As a result, the out-diffusion of the single side buried strap may induce short channel effect and increase the contact resistance between the transistor drain region and the single side buried strap. Thus, the current and threshold voltage of the transistor are reduced, thereby reducing the memory device performance.

BRIEF SUMMARY OF INVENTION

A detailed description is given in the following embodiments with reference to the accompanying drawings. A deep trench device with a single sided connecting structure and a fabrication method thereof are provided.

An embodiment of a deep trench device with a single sided connecting structure comprises a substrate having a trench therein. A buried trench capacitor is disposed in a lower portion of the trench. An asymmetric collar insulator is disposed on an upper portion of the sidewall of the trench, having a relatively high portion and a relatively low portion. A connecting structure is disposed in the upper portion of the trench, comprising an epitaxial silicon layer disposed on and adjacent to the relatively low portion of the asymmetric collar insulator and a connecting member disposed between the epitaxial silicon layer and the relatively high portion of the asymmetric collar insulator. A conductive layer is disposed between the relatively high and low portions of the asymmetric collar insulator, to electrically connect the buried trench capacitor and the connecting structure. A cap layer is disposed on the connecting structure.

An embodiment of a method for fabricating a deep trench device with a single sided connecting structure comprises providing a substrate having a trench therein. A buried trench capacitor is formed in a lower portion of the trench. An asymmetric collar insulator is formed on an upper portion of the sidewall of the trench, wherein the asymmetric collar insulator has a relatively high portion and a relatively low portion. A conductive layer is formed on the buried trench capacitor. A connecting structure is formed on the conductive layer to electrically connect the buried trench capacitor, wherein the connecting structure comprises an epitaxial silicon layer disposed on and adjacent to the relatively low portion of the asymmetric collar insulator and a connecting member disposed between the epitaxial silicon layer and the relatively high portion of the asymmetric collar insulator. A cap layer is formed on the connecting structure.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best contemplated mode of carrying out the invention. This description is provided for the purpose of illustrating the general principles of the invention and should not be taken in a limiting sense. The scope of the invention is best determined by reference to the appended claims. The deep trench device with a single sided connecting structure and the fabrication method thereof will be described below with reference to the accompanying drawings.

Figure 1A:
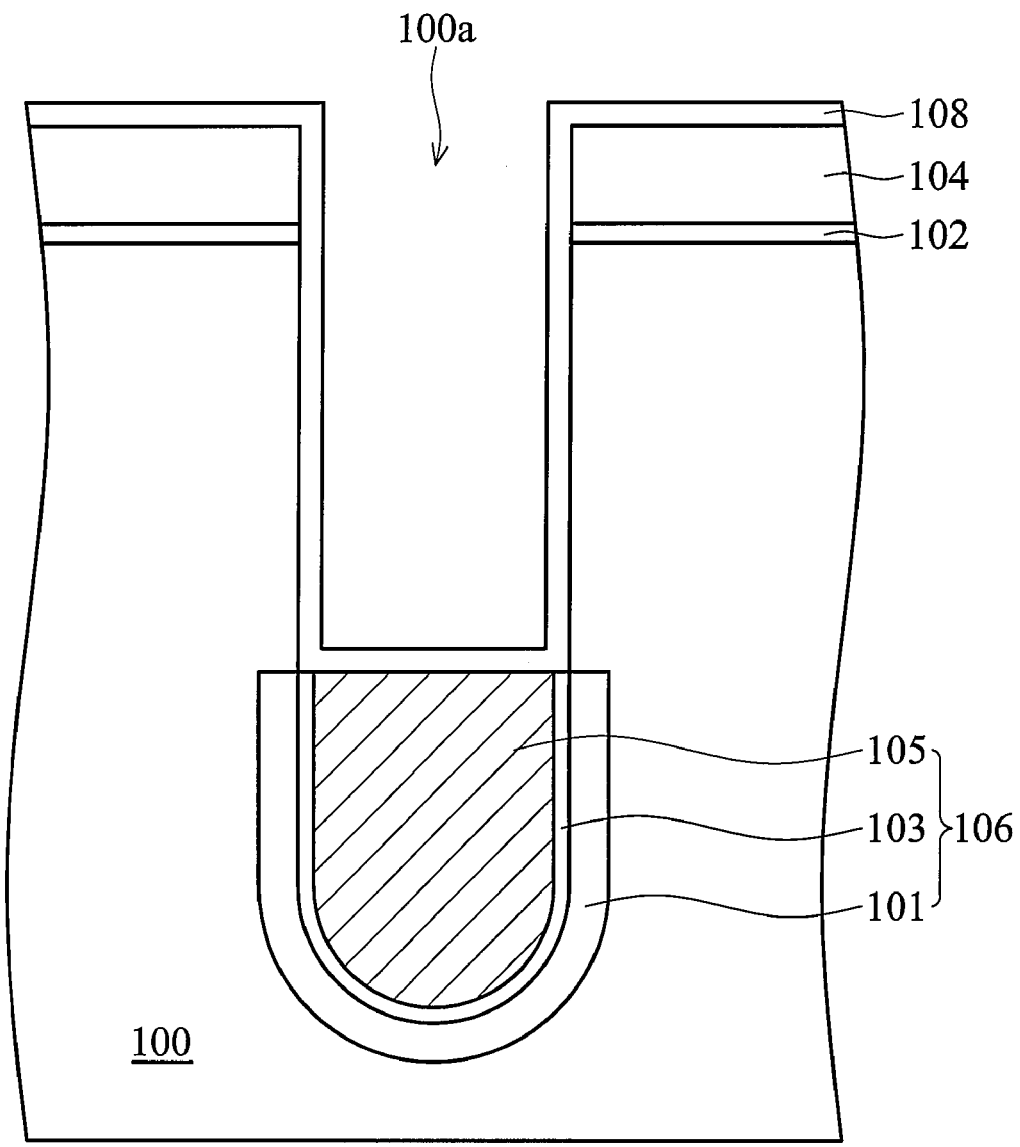
FIGS. 1A to 1K are cross-sections of an embodiment of a method for fabricating a deep trench device with a single sided connecting structure.
Figure 1B:
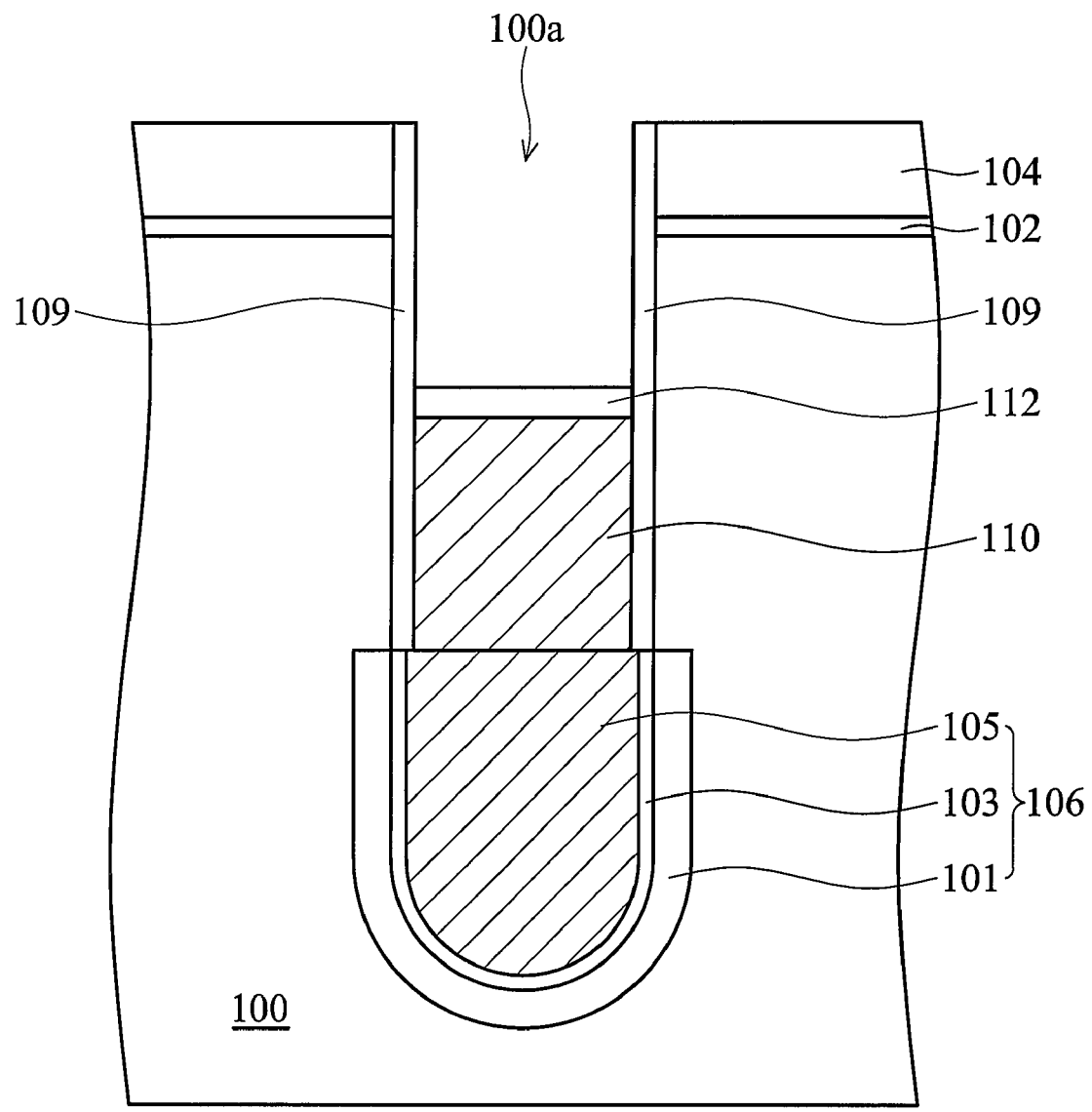
Figure 1C:
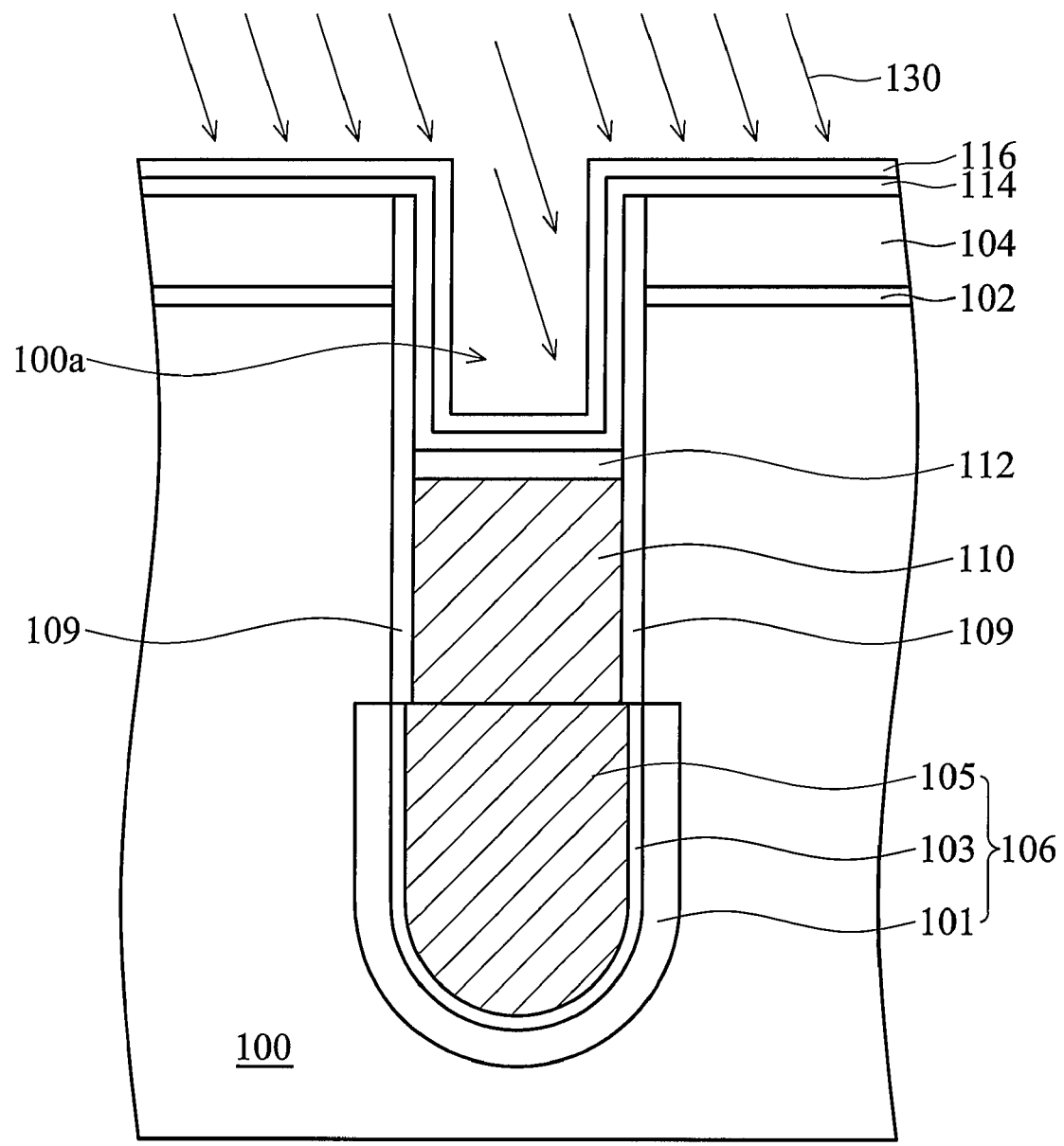
Figure 1D:
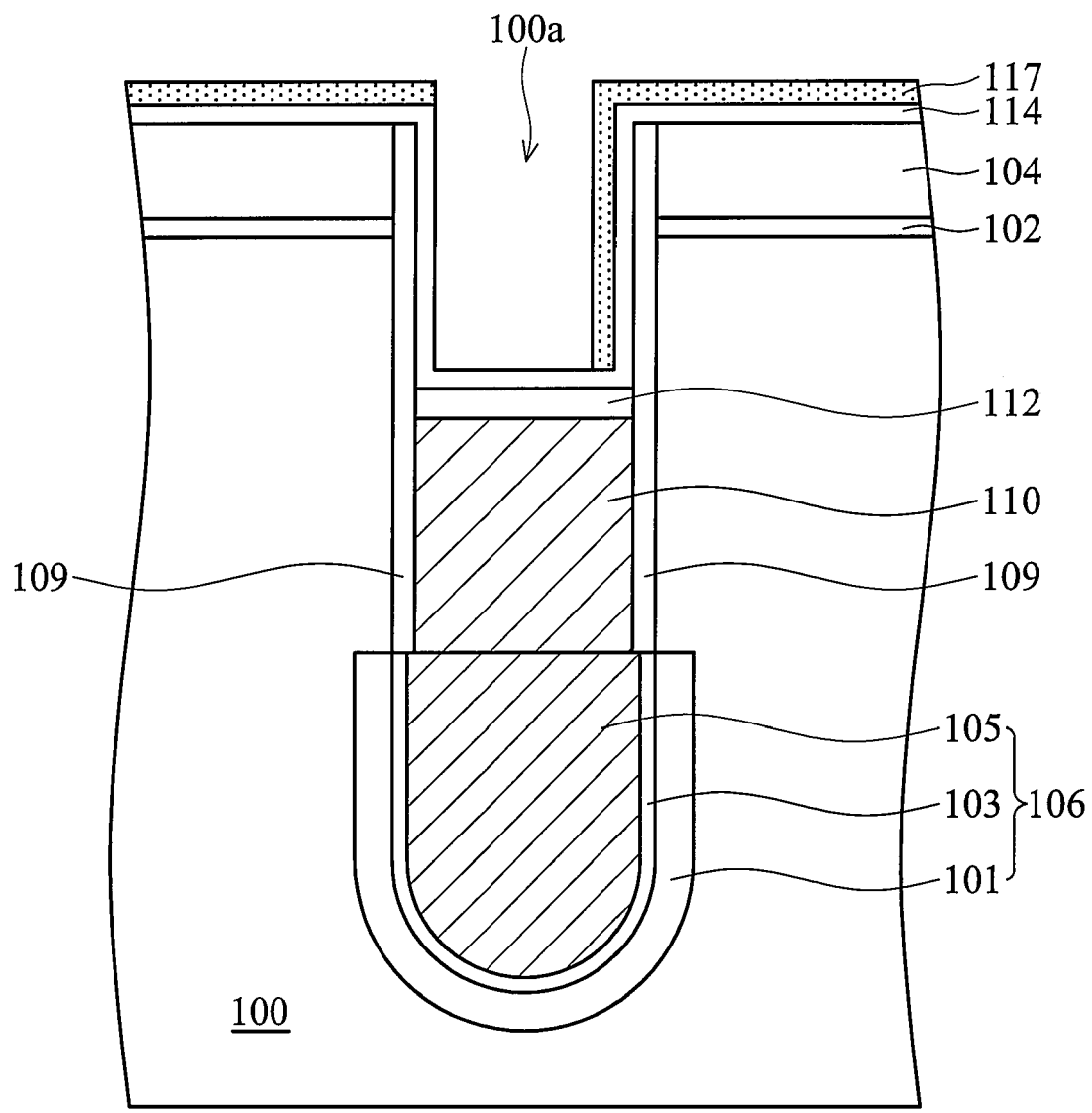
Figure 1E:
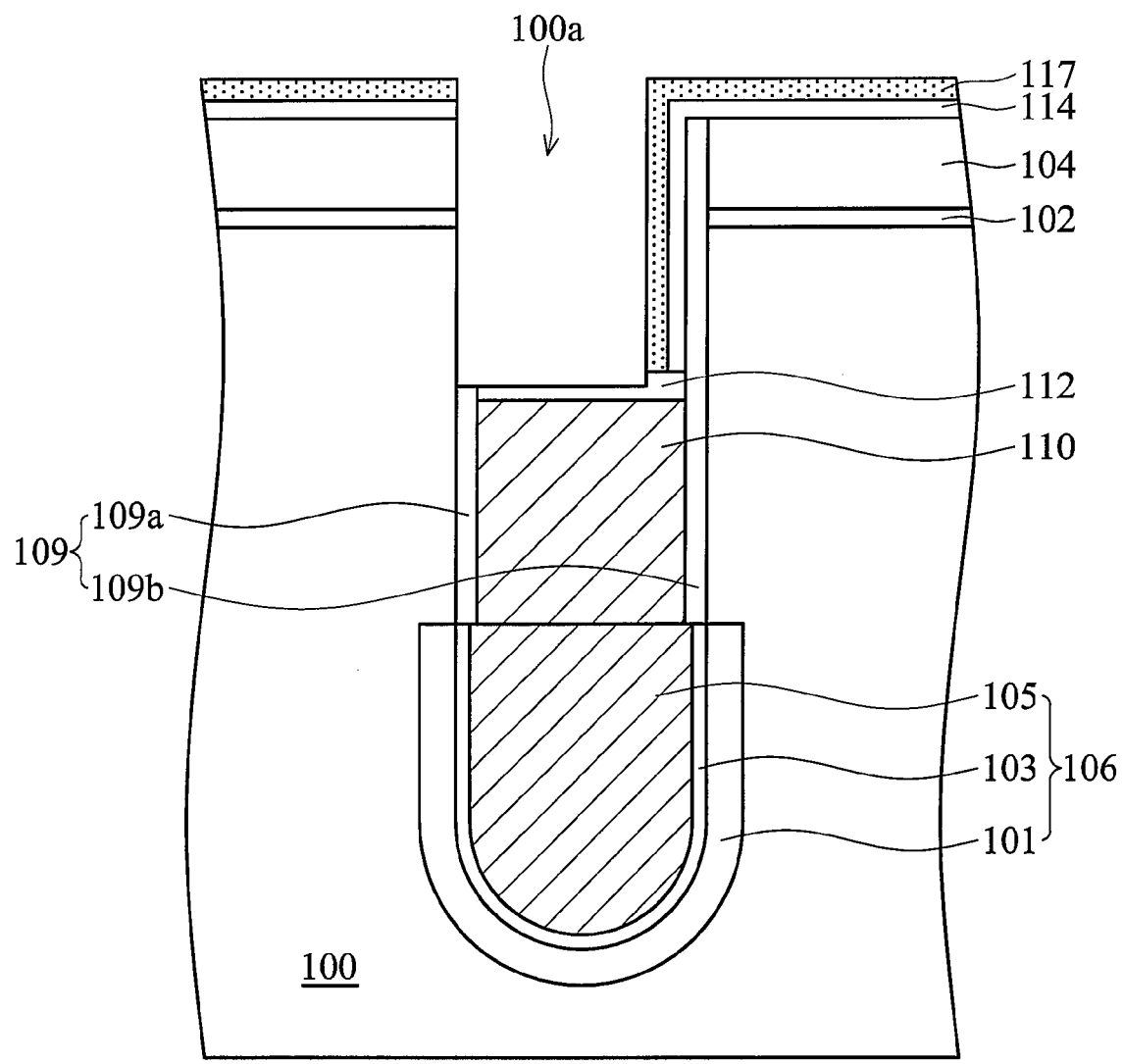
Figure 1F:
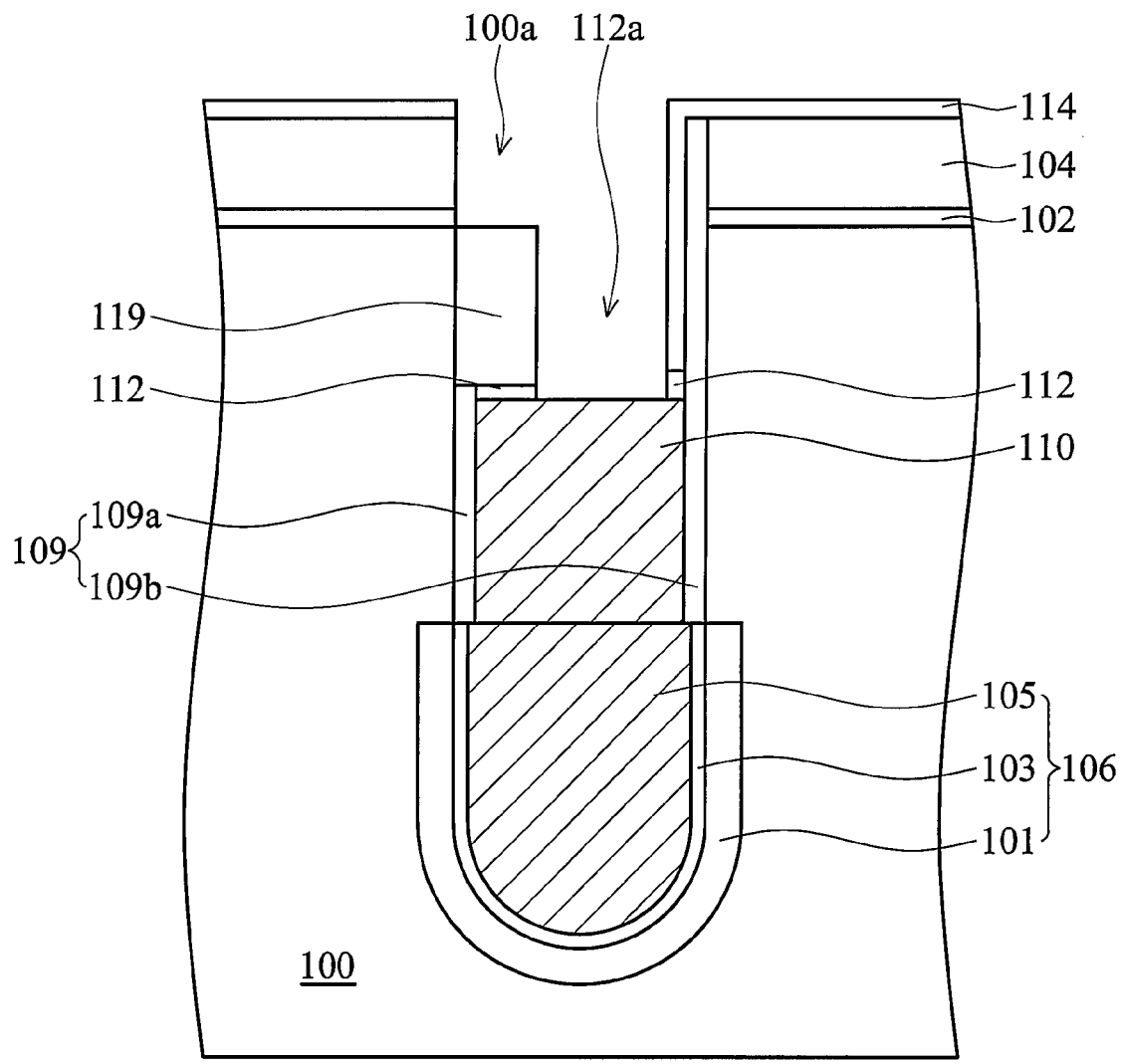
Figure 1G:
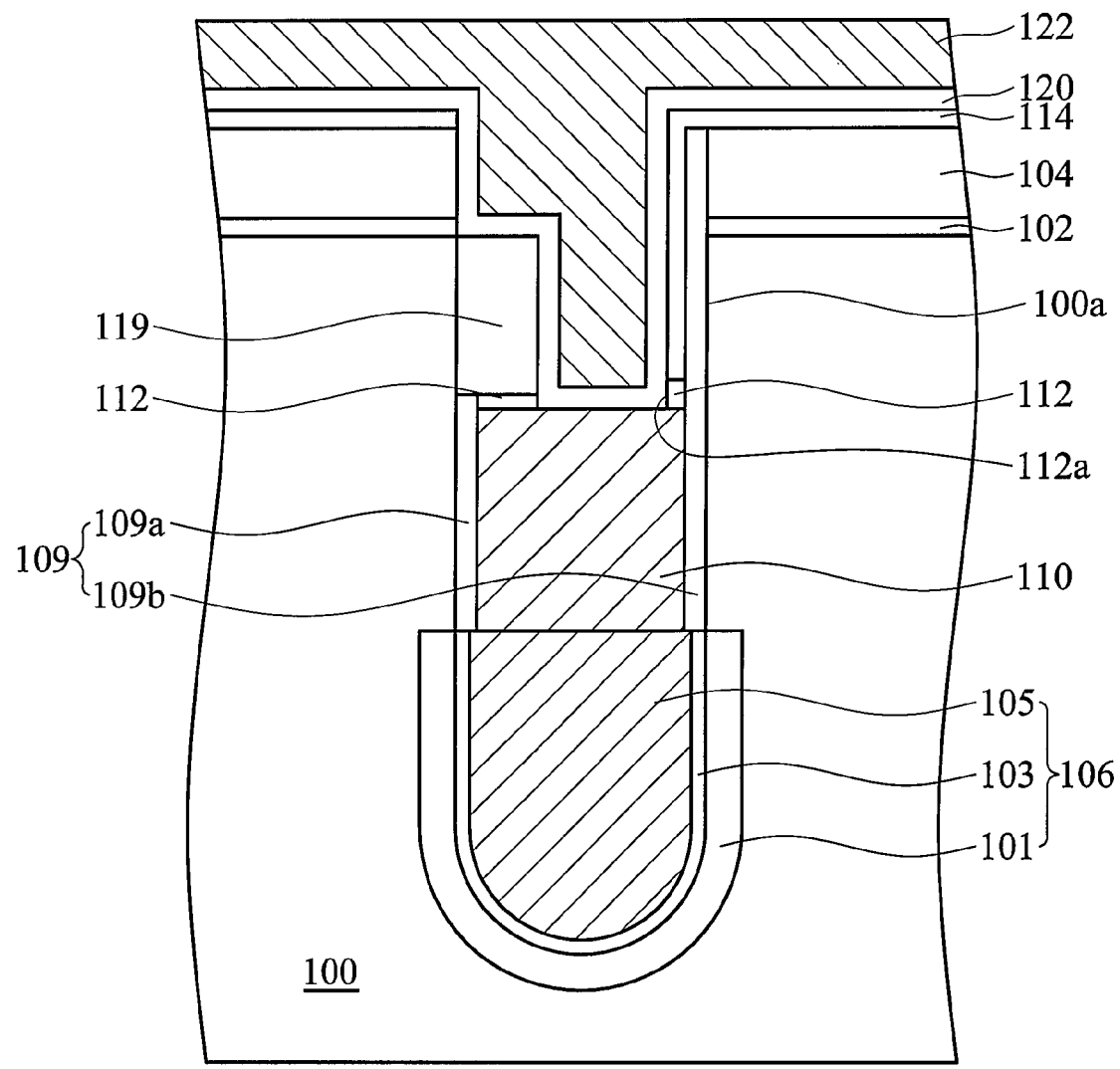
Figure 1H:
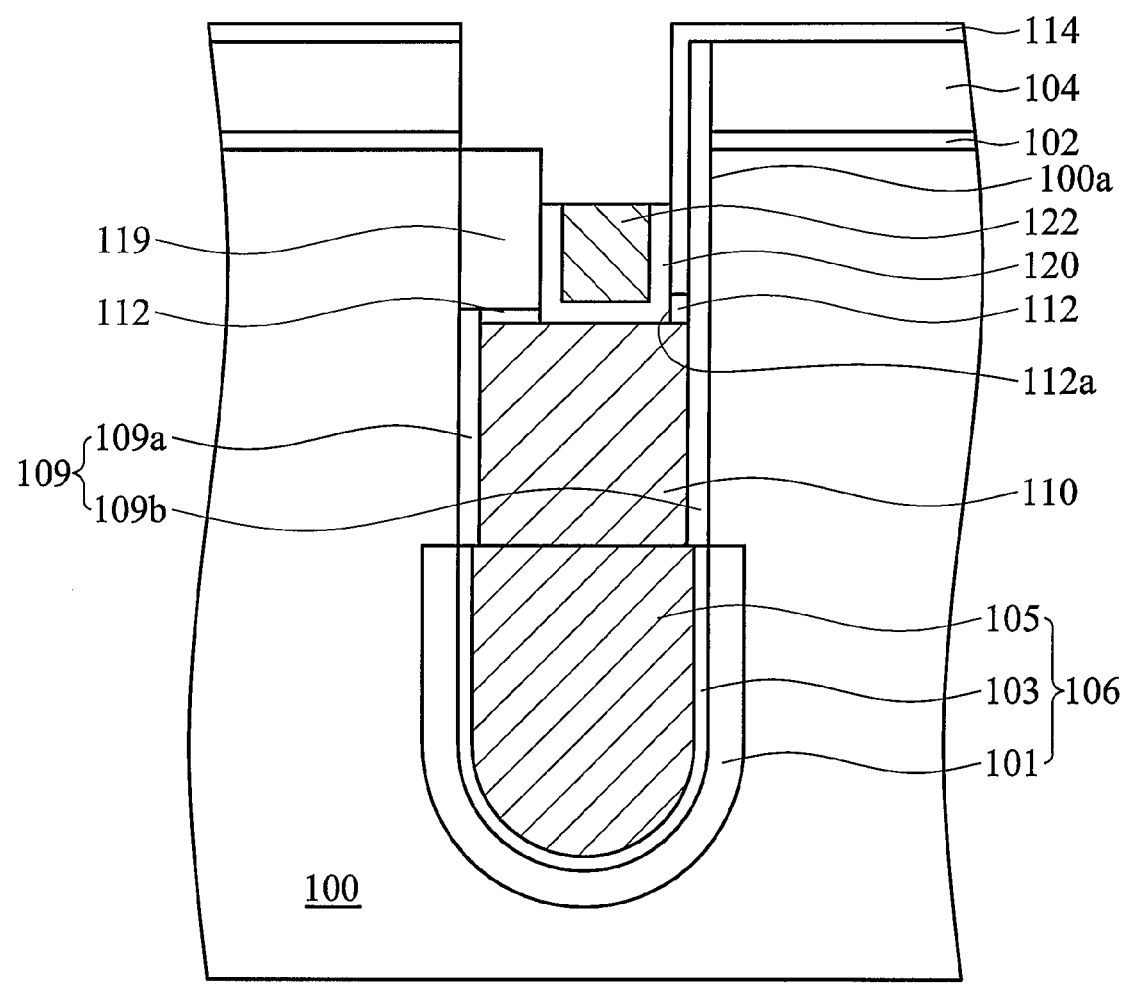
Figure 1I:
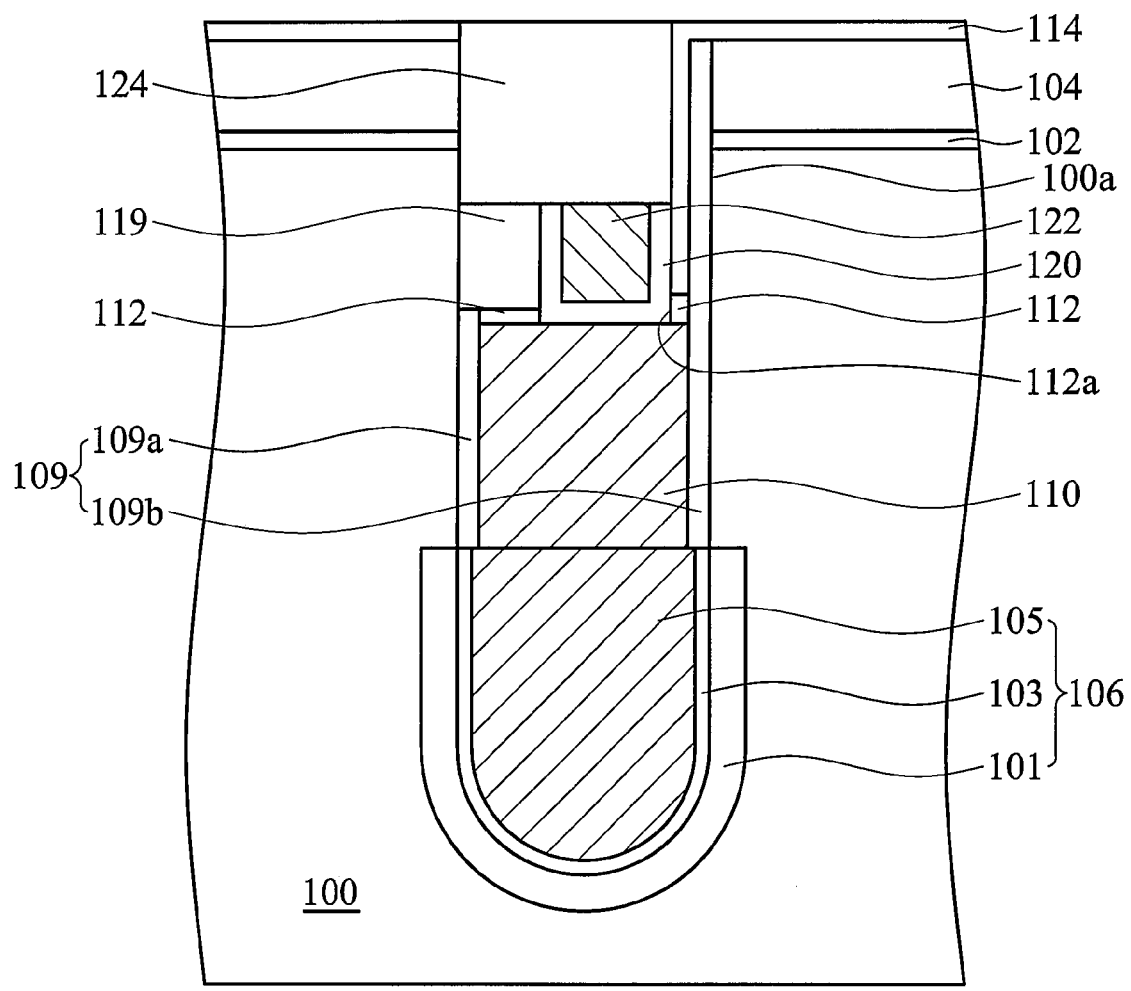
Figure 1J:
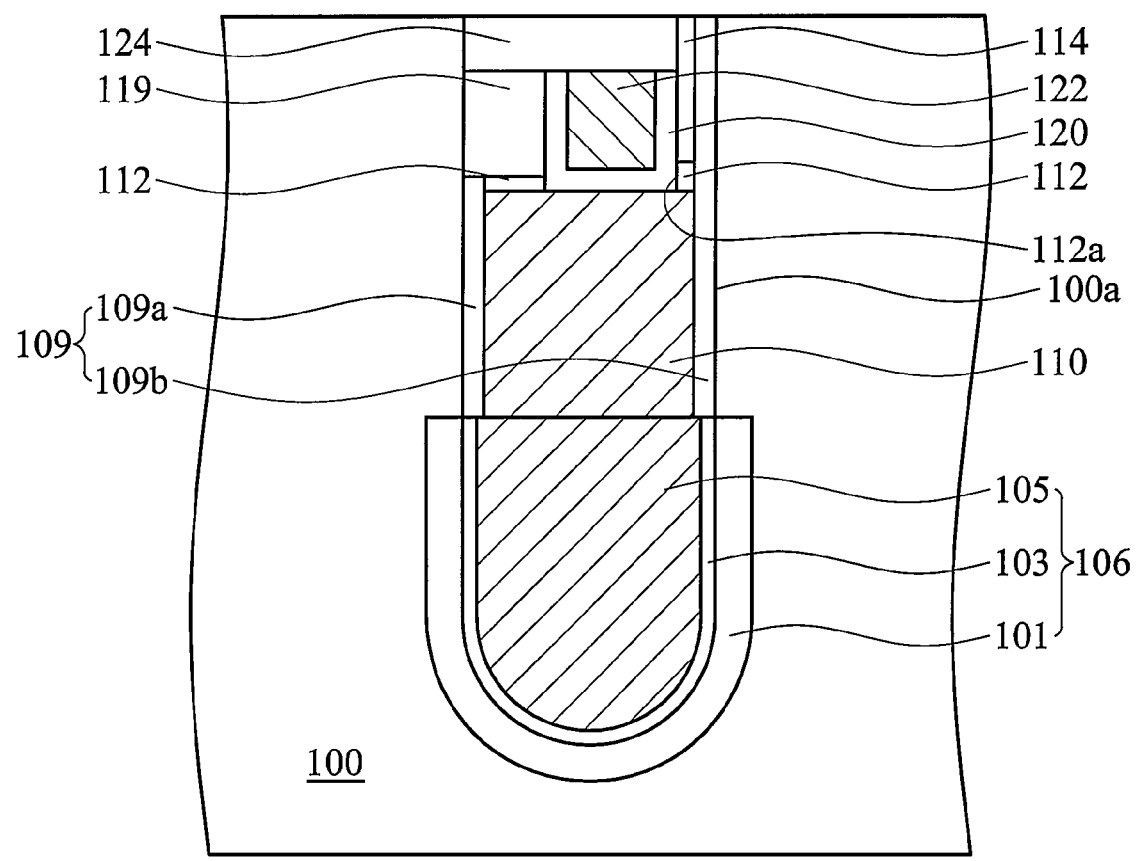

Referring to FIG. 1J, an embodiment of a deep trench device with a single sided connecting structure for a memory cell, such as a DRAM is illustrated. The trench device comprises: a substrate 100, a buried trench capacitor 106, an asymmetric collar insulator 109, a conductive layer 110, an insulating layer 112, a connecting structure and a cap layer 124. The substrate 100, such as silicon or other suitable semiconductor substrates, has at least one trench 100a formed therein. The buried trench capacitor 106 is disposed in a lower portion of the trench 100a, comprising a buried lower electrode 101, an upper electrode 105 and a capacitor dielectric layer 103 interposed therebetween.

The asymmetric collar insulator 109 is disposed on an upper portion of the sidewall of the trench 100a, having a relatively low portion 109a and a relatively high portion 109b. The conductive layer 110, such as a doped polysilicon layer, is disposed on the buried trench capacitor 106 and between a lowermost portion and an uppermost portion of the collar insulator 109. That is, the conductive layer 110 is surrounded by the collar insulator 109. The insulating layer 112 is disposed on the conductive layer 110, having an opening 112a to expose a portion of the conductive layer 110.

The connecting structure is disposed on the upper portion of the trench 100a and above the conductive layer 110, comprising an epitaxial silicon layer 119 and a connecting member 122. The epitaxial silicon layer 119 is disposed on the relatively low portion 109a of the asymmetric collar insulator 109 and covers a portion of the insulator layer 112. The connecting member 122, such as a tungsten or other refractory connecting member, is disposed between the relatively high portion 109b of the asymmetric collar insulator 109 and the epitaxial silicon layer 119 and corresponds to the opening 112a of the insulating layer 112. In the embodiment, the epitaxial silicon layer 119 has a graded doping concentration. For example, the doping concentration of the epitaxial silicon layer 119 is increased from the sidewall to the center of the trench 100a.

Additionally, in order to reduce Schottky barrier between the connecting member 122 and the epitaxial silicon layer 119 and between the connecting member 122 and the conductive layer 110, and prevent atom diffusion from the epitaxial silicon layer 119, a metal barrier layer 120 may be disposed on the sidewall and bottom of the connecting member 122 and extended into the opening 112a of the insulating layer 112. The metal barrier layer 120 may comprise titanic nitride (TiN), or titanic/tungsten nitride (Ti/WN). As a result, the connecting structure may be electrically connected to the buried trench capacitor 106 through the conductive layer 110 under the opening 112a of the insulating layer 112. In the embodiment, the connecting member 122 in the trench 100a is insulated from the substrate 100 by the relatively high portion of the asymmetric collar insulator 109. Moreover, only the epitaxial silicon layer 119 can be electrically connected to the transistor drain region formed in subsequent process steps. Accordingly, the structure is called a single sided connecting structure.

FIGS. 1A to 1K are cross-sections of an embodiment of a method for fabricating a deep trench device with a single sided connecting structure. As shown in FIG. 1A, a substrate 100, such as silicon or other suitable semiconductor substrates, is provided. The substrate 100 has at least one trench 100a formed therein. Moreover, the trench 100a can be formed by defining the masking layer on the substrate 100. In the embodiment, the masking layer may comprise a pad oxide layer 102 and an overlying silicon nitride layer 104.

A buried trench capacitor 106 is formed in a lower portion of the trench 100a by conventional fabrication. The buried trench capacitor 106 comprises a buried lower electrode 101, a capacitor dielectric layer 103 and an upper electrode 105. For example, deposition of a doped oxide material, such as arsenic silica glass (ASG), is performed. Next, drive-in process is performed, such that ions in the doped oxide material are out-diffused into the semiconductor substrate 100 at the lower portion of the trench 100a to form a diffusion region serving as the buried lower electrode of the capacitor 106. Next, the capacitor dielectric layer 103, which may comprise silicon nitride, oxide-nitride (ON) dual-layers, or oxide-nitride-oxide (ONO) tri-layers, is formed on the sidewall and bottom of the trench 100a. The trench 100a is filled with a doped polysilicon layer 105 and then the doped polysilicon layer 105 is recessed to a predetermined thickness. Thereafter, the exposed capacitor dielectric layer 103 above the doped polysilicon layer 105 is removed to complete the fabrication of the buried trench capacitor 106. An insulating layer 108, such as a silicon oxide layer, may be conformally formed on the silicon nitride layer 104 and in the trench 100a by chemical vapor deposition (CVD).

Next, as shown in FIG. 1B, the insulating layer 108 on the silicon nitride layer 104 and the buried trench capacitor 106 is removed by reactive ion etching (RIE), to form a symmetric collar insulator 109. A conductive layer 110, such as a doped polysilicon layer, is subsequently formed on the buried trench capacitor 106 in the trench 100a and then recessed to a predetermined thickness. An insulating layer 112 is formed on the conductive layer 110. For example, a silicon oxide layer is formed on the top of the conductive layer 110 by thermal oxidation or high density plasma chemical vapor deposition (HDPCVD), to serve as a top trench oxide (TTO) layer.

As shown in FIG. 1C, a liner 114 and an undoped silicon layer 116 are successively formed on the silicon nitride layer 104 and conformally cover the collar insulator 109. In the embodiment, the liner 114 may comprise silicon nitride and be formed by low pressure chemical vapor deposition (LPCVD). The undoped silicon layer 116 may comprise polysilicon or amorphous silicon and be formed by LPCVD. Thereafter, tilt angle ion implantation is performed in the undoped silicon layer 116 at a preferable tilt implant angle of 7° to 15°, using $BF_2$, B or $B_{18}H_{22}$ as a dopant. As a result, the undoped silicon layer 116 on a portion of sidewall of the trench 100a and the bottom of the undoped silicon layer 116 will be shielded and not implanted.

As shown in FIG. 1D, the non-implanted undoped silicon layer 116 is removed by, for example, $NH_4OH$, to expose a portion of liner 114. Next, the non-implanted undoped silicon layer 116 is oxidized to form a silicon oxide layer 117 serving as an etch mask for the liner 114.

As shown in FIG. 1E, the exposed liner 114 in the trench 100a is removed by wet etching, to expose portions of the collar insulator 109 and the insulating layer 112. Also, the exposed collar insulator 109 is removed by wet etching to form an asymmetric collar insulator 109 having a relatively low portion 109a and a relatively high portion 109b. Note that if the insulating layer 112 and the collar insulator 109 are formed by the same material, such as silicon oxide, a portion of the insulating layer 112 may be removed during etching.

As shown in FIG. 1F, after removal of the silicon oxide layer 117, a single sided connecting structure is formed on the conductive layer 110. An embodiment of fabrication of the single sided connecting structure is described as follow. An epitaxial silicon layer 119 with a predetermined thickness is formed along a direction perpendicular to the sidewall of the trench 100a by a selective epitaxy process and covers a portion of the insulating layer 112. In particular, the epitaxial silicon layer 119 can be formed by two steps. In the first step, an epitaxial silicon layer without doping is grown to a first thickness. Next, in the second step, the epitaxial silicon layer is doped and grown to a second thickness. As a result, the epitaxial silicon layer 119 can have different doping concentrations in different areas of the epitaxial silicon layer 119, in which the doping concentration of the epitaxial silicon layer 119 increases from the sidewall to the center of the trench 100a. Next, the epitaxial silicon layer 119 is used as an etch mask to remove the insulating layer 112 uncovered by the epitaxial silicon layer 119, thereby forming an opening 112a in the insulating layer 112 and exposing a portion of the conductive layer 110.

As shown in FIG. 1G, a metal barrier layer 120 comprising titanic nitride (TiN), or titanic/tungsten nitride (Ti/WN) is conformally formed on the substrate 100. Next, a connecting member 122 is formed on the metal barrier layer 120 above the substrate 100 and fills the trench 100a. In the embodiment, the connecting member 122 may comprise tungsten or other refractory metal. In some embodiments, metal silicide, such as tungsten silicide ($WSi_x$) may be used instead of the connecting member 122.

As shown in FIG. 1H, the excess connecting member 122 and metal barrier layer 120 are removed by chemical mechanic polishing (CMP) to expose the liner 114. Thereafter, the connecting member 122 and the metal barrier layer 122 are successively etched back, such that the height of the connecting member 122 and the metal barrier layer 122 lower than that of the epitaxial silicon layer 119.

As shown in FIG. 1I, the epitaxial silicon layer 119 is etched back, such that the epitaxial silicon layer 119 is substantially level with the connecting member 122, thus the single sided connecting structure is completed. Next, the trench 100a is filled with an insulating layer serving as a cap layer 124 for the deep trench device. The fabrication of the cap layer 124 may comprise forming a silicon oxide layer by HDPCVD. Next, as shown in FIG. 1J, the excess silicon oxide layer on the substrate 100 is removed by CMP. During CMP, the silicon nitride layer 104 and the pad oxide layer 103 can be simultaneously removed to expose the substrate 100. In some embodiments, wet etching can be instead of CMP.

Figure 1K:
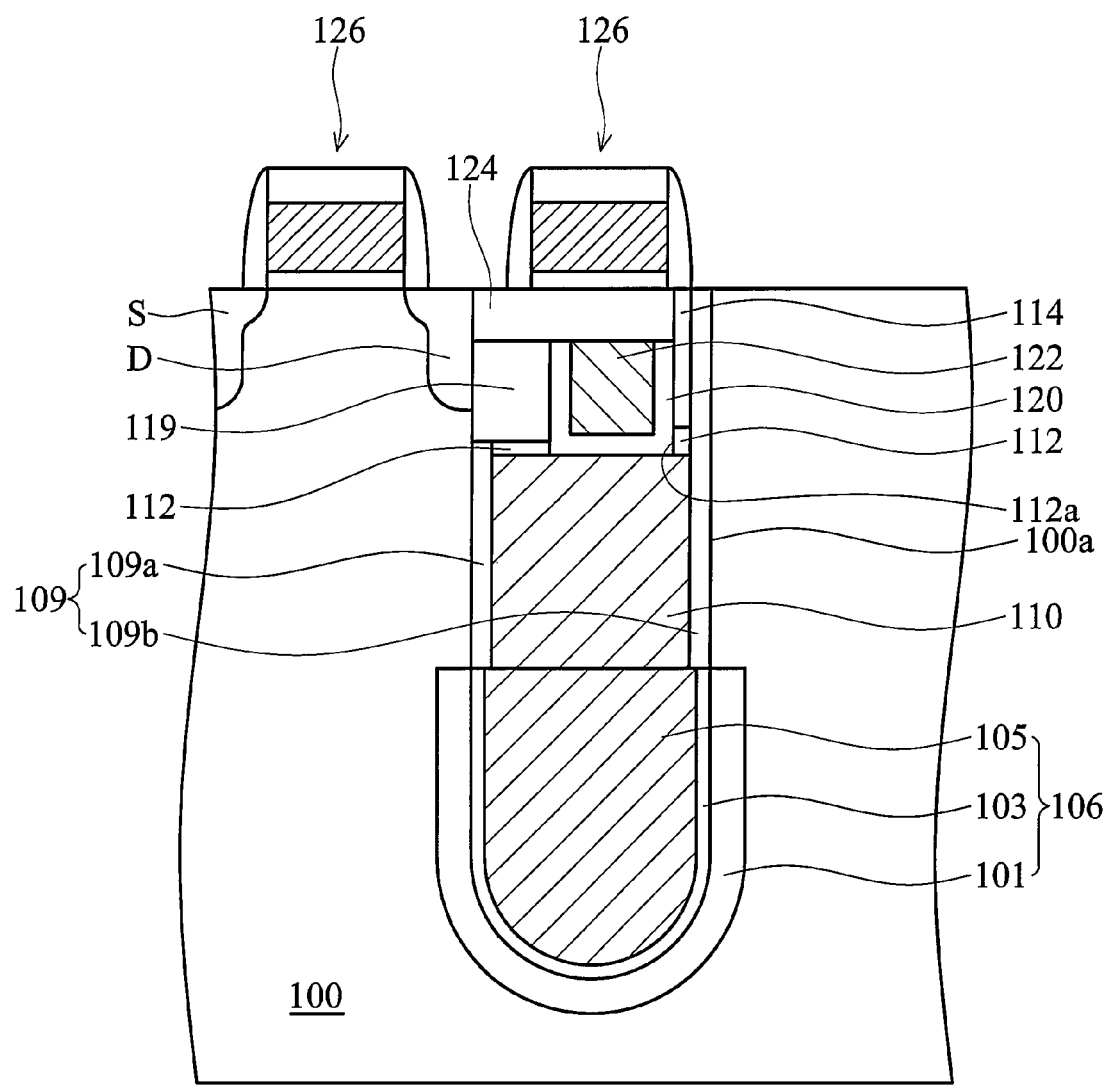

As shown in FIG. 1K, after the fabrication of the single sided connecting structure, a plurality of word lines 126 is formed on the substrate 100 by conventional fabrication methods. The word line 126 is typically composed of a transistor. Such a transistor comprises a gate structure and source/drain regions S/D. The gate structure typically comprises a gate dielectric layer, a gate electrode, a cap layer on the gate electrode and gate spacers on the sidewalls of the gate electrode. The word line 126 is electrically connected to the buried trench capacitor 106 through contact with the transistor drain region D and the epitaxial silicon layer 119. Thereafter, a plurality of bit lines (not shown) is formed over the word lines 126 to complete the fabrication of the memory cells.

According to the embodiment, since the single sided connecting structure is formed in the trench, as opposed to the conventional diffusion region (i.e. buried strap) short channel effect due to out-diffusion of the buried strap can be eliminated. Moreover, since the used epitaxial silicon layer in the single sided connecting structure has different doping concentrations, increase in junction field effect due to the size shrinkage of the memory cell can be mitigated. Additionally, compared to the conventional buried strap, the used connecting member in the single sided connecting structure can suppress increase in contact resistance due to the size shrinkage of the memory cell.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A deep trench device, comprising:
    a trench capacitor structure disposed in a bottom portion of a trench in a substrate, wherein the substrate has a drain region adjacent to the trench;
    a collar insulator formed on a sidewall of the trench and surrounding a portion of the trench capacitor structure, the collar insulator having a tapered height with regard to an outer peripheral sidewall of the trench, wherein a lowermost height of the collar insulator exposes a portion of the sidewall of the trench and an uppermost height of the collar insulator fully covers a portion of the sidewall of the trench;
    a connecting structure disposed in the trench and on top of the trench capacitor structure to electrically connect the trench capacitor structure to the drain region, wherein the connecting structure comprises:
        a connecting member formed on top of the trench capacitor structure so as to electrically connect to the trench capacitor structure; and
        an epitaxial silicon layer connected with the portion of the sidewall of the trench, where the lowermost portion of the collar insulator exposes and being adjacent to the connecting member; and
    a cap layer disposed on the connecting structure.

2. The deep trench device as claimed in claim 1 further comprising an insulating layer disposed between the connecting structure and the trench capacitor structure, the insulating layer having an opening defined to correspond to a location of the connecting member such that the connecting member is electrically connected to the trench capacitor structure via the opening.

3. The deep trench device as claimed in claim 2, wherein the connecting structure further comprises a metal barrier layer surrounding and on bottom of the connecting member.

4. The deep trench device as claimed in claim 3, wherein the epitaxial silicon layer has a graded doping concentration.

5. The deep trench device as claimed in claim 4, wherein the trench capacitor structure comprises a capacitor disposed in the trench, and a conductive layer disposed on top of the capacitor in the trench.

6. The deep trench device as claimed in claim 1, wherein the connecting member comprises tungsten.

7. The deep trench device as claimed in claim 6, wherein the conductive layer is surrounded by the collar insulator.

8. The deep trench device as claimed in claim 1, wherein the cap layer comprises silicon oxide.

* * * * *